United States Patent [19]

Iwasa et al.

[11] Patent Number: 4,837,050

[45] Date of Patent: * Jun. 6, 1989

[54] METHOD FOR PRODUCING ELECTRICALLY CONDUCTIVE CIRCUITS ON A BASE BOARD

[75] Inventors: Yamahiro Iwasa, Hachioji; Yoichi Oba, Higashiyamato; Isao Morooka, Hachioji, all of Japan

[73] Assignee: Asahi Chemical Research Laboratory Co., Ltd., Tokyo, Japan

[ * ] Notice: The portion of the term of this patent subsequent to Mar. 29, 2005 has been disclaimed.

[21] Appl. No.: 79,401

[22] Filed: Jul. 30, 1987

[30] Foreign Application Priority Data

Sep. 30, 1986 [JP] Japan .................................. 61-233928
Sep. 30, 1986 [JP] Japan .................................. 61-233929
Sep. 30, 1986 [JP] Japan .................................. 61-233930

[51] Int. Cl.⁴ .............................................. B05D 5/12
[52] U.S. Cl. ........................................ 427/96; 427/58; 29/830; 29/831
[58] Field of Search ...................... 427/96, 58; 29/830, 29/831

[56] References Cited

U.S. PATENT DOCUMENTS

| | | | |
|---|---|---|---|
| 3,214,827 | 11/1965 | Prohofsky | 29/830 |
| 3,680,209 | 8/1972 | Hacke | 29/831 |
| 3,831,270 | 8/1974 | Huddleston | 29/831 |
| 4,353,816 | 10/1982 | Iwasa | 252/511 |
| 4,438,560 | 3/1984 | Kisters | 29/830 |
| 4,683,653 | 8/1987 | Iwasa | 29/830 |
| 4,724,040 | 2/1988 | Iwasa | 427/96 |

FOREIGN PATENT DOCUMENTS 58068 8/1982 European Pat. Off. .............. 29/831
2181303A 4/1987 United Kingdom .................. 29/830

Primary Examiner—Shrive Beck
Assistant Examiner—Vi Duong Dang
Attorney, Agent, or Firm—Robert F. Ziems

[57] ABSTRACT

A method is described for producing electrically conductive circuits on a print base board having a copper lamination attached on one side face thereof, and more particularly relates to such method for producing the circuits of excellent electrical conductivity by effectively utilizing a newly developed electrically conductive copper paste which is specifically adapted to metal plating, wherein at least two-layer circuits are formed on one side of the base board, of which a first-layer circuit having a plurality of electrodes and a second-layer circuit having a plurality of ring-shaped electrodes formed in connection with the electrodes of the first-layer circuits, each electrode of the second-layer circuit being defined by outer and inner circumferences with a central opening defined by the inner circumference, such that the metal plating applied to the electrodes of the first- and second-layer circuits with a predetermined thickness of the metal plating layer may provide an electrically conductive path between the two circuits including an elongated total length of the metal plating layer connected to the first-layer circuit, the metal plating layer having an enlarged sectional area to increase the electrical conductivity and to increase the adherence force of the second-layer circuit to the first-layer circuit.

15 Claims, 7 Drawing Sheets

METHOD FOR PRODUCING ELECTRICALLY CONDUCTIVE CIRCUITS ON A BASE BOARD

BACKGROUND OF THE INVENTION

The invention relates to a method for producing electrically conductive circuits on a print base board having a copper lamination attached on one side face thereof, and more particularly relates to such method for producing the circuits of excellent electrical conductivity by effectively utilizing a newly developed electrically conductive copper paste which is specifically adapted to metal plating, wherein at least two-layer circuits are formed on one side of the base board, of which a first-layer circuit having a plurality of electrodes and a second-layer circuit having a plurality of ring-shaped electrodes formed in connection with the electrodes of the first-layer circuits, each electrode of the second-layer circuit being defined by outer and inner circumferences with a central opening defined by the inner circumference, such that the metal plating applied to the electrodes of the first- and second-layer circuits with a predetermined thickness of the metal plating layer may provide an electrically conductive path between the two circuits including an elongated total length of the metal plating layer connected to the first-layer circuit, the metal plating layer having an enlarged sectional area to increase the electrical conductivity and to increase the adherence force of the second-layer circuit to the first-layer circuit.

It is generally known that the more or less complex circuits formed on a base board have some portions to be electrically connected to each other. So far it has been industrially difficult to form more than two-layer circuits on one side of the base board, and therefore the circuits have been formed, one on one side face of the base board and another on the opposite side face of the base board by etching the copper lamination attached to each side of the base board, and then the two circuits have been electrically connected to each other by means of a through-hole extended vertically of the base board.

According to such a conventional method, it is required to attach copper laminations on both sides of the base board and to etch the copper laminations to form circuits thereon respectively and then to form many through-holes in the base board by way of the NC device. The production cost is therefore considerably high including the costs for the materials to be used and the processing steps, and moreover the production efficiency is lower.

It is therefore desired to form more than two-layer circuits on one side face of the base board. To satisfy this requirement, it has been needed to develop an electrically conductive paste which is of lower cost and excellent in electrical conductivity and further specifically adapted to a metal plating such as a copper plating. The development of such an electrically conductive copper paste has been difficult because copper is very easily oxidized by heat in contrast to the precious metals such as gold resulting in increasing the electric resistance and deteriorating the soldering effect. Further in order to apply a metal plating to the heated and hardened electrically conductive copper paste, it has been required to activate the surface of the copper paste by means of a catalyst so as to depose the copper particles to the surface of the copper paste from among the binders of a resin layer contained therein, which copper particles being the nucleuses for making effect the subsequent metal plating.

The Japanese Utility Model application (laid open No. 55-42460) discloses a method for forming more than two-layer circuits on one side face of a base board, wherein a high isolation-resistant polybutadiene is employed for formation of an isolation film, and the base circuit is covered with a copper film in such a manner that an adhesive paste of 20% of phenol resin, 63% of copper particles and 17% of solvent is coated on the base circuit, and then a non-electrolytic plating is applied to the adhesive paste to form a plating film up to 20 $\mu$m thereon. Such a method has never been reduced to practice due to the demerits as mentioned above.

The applicant has continued for many years to work for development of electrically conductive copper pastes which may eliminate the defects and disadvantages of the prior art, and succeeded in realization of such copper pastes to be industrially utilized. These are the electrically conductive copper pastes ACP-020, ACP-030 and ACP-007P developed by Asahi Chemical Research Laboratory Co., Ltd. which are substantially composed of copper particles, synthetic resins and a small amount of anthracene as a specific additive by way of example.

The copper paste APC-020 is substantially composed of 80% by weight of copper particles and 20% by weight of synthetic resins, and is excellent in electric conductivity, but not so good in the soldering property. The copper paste ACP-030 is substantially composed of 85% by weight of copper particles and 15% by weight of synthetic resins, and is not so good as the copper paste ACP-020 in electric conductivity but excellent in the soldering property. The copper paste ACP-007P is an improvement of the copper paste ACP-030 which may be subject to a metal plating such as a chemical copper plating to be applied to the hardened surface thereof without the need of catalyst treatment, and is extremely excellent in the metal plating property.

According to the invention, the electrically conductive copper paste ACP-007P is employed. The copper paste is coated on the first-layer circuit which may be subject to a metal plating and then is heated to be hardened. Subsequently a metal plating is applied to the copper paste to form the second-layer circuit on the first-layer circuit, the former being electrically connected to the latter, to thereby form at least two-layer circuits on one side face of base board.

In fact, this method is disclosed in the Japanese patent application No. 60-216041 (corresponding to U.S. Pat. No. 4,734,156). According to the method, as shown in FIGS. 15 and 16, a first-layer circuit $C_1$ is formed on a copper lamination 2 attached to one side face of a base board 1 by etching the copper lamination. Then a plating-resistant resist 3 is coated by way of printing all over the base board except the portions 2a,2b of the first-layer circuit which are to be electrically connected to an additional circuit to be formed on the first-layer circuit, though the resist 3 is not seen in FIG. 15 because the resist is transparent. Subsequently the electrically conductive copper paste 4 (ACP-007P) which is specifically adapted to a metal plating is coated by way of a screen printing on the portions which remain without the resist being coated thereon, and is then heated to be hardened and is washed to be clean. Then a chemical copper plating by way of example as a metal plating is applied to the electrically conductive copper paste 4 to form a copper plating layer 5 thereon to thereby provide the second-layer circuit $C_2$ of the copper plating layer and the electrically conductive copper paste 4. Thus at least two-layer circuits $C_1$, $C_2$ are formed on one side face of the base board.

However according to this method, as shown in FIG. 15, the electrically conductive copper paste 4 coated on each electrode $2d$ of the first-layer circuit $C_1$ is in a shape of a bar with a predetermined width having an end $4a$ defined by an arc. In this connection, the electric conductivity of the copper plating layer 5 with respect to the electrode $2d$ depends on a total area of the thickness $5a$ of the copper plating layer 5, that is a dotted area in FIG. 15, which is connected to the electrode $2d$ of the first-layer circuit $C_1$. In short, the conductivity depends on the dimensions the sectional area of the electrically conductive path provided between the first- and second-layer circuits $C_1, C_2$. Further the adhesion force of the second-layer circuit $C_2$ to the first-layer circuit $C_1$ depends on the area of each electrode $4d$ of the second-layer circuit $C_2$ including the outer boundary $4e$ of the electrode $4d$. It is therefore apparent that the shape of the electrode $4d$ of the second-layer circuit $C_2$ is not sufficient to provide a desired electric conductivity and a desired adherence force of the second-layer circuit $C_2$ to the first-layer circuit $C_1$.

OBJECTS OF THE INVENTION

The present invention has been provided to eliminate the defects and disadvantages of the prior art. It is therefore an object of the invention to form each electrode of the second-layer circuit which is defined by the outer and inner boundaries of the electrically conductive copper paste coated on each electrode of the first-layer circuit with a central opening defined by the inner boundary and which is further defined by the metal plating layer of a predetermined thickness provided by the metal plating applied to each electrode of the second-layer circuit and connected to the electrode of the first-layer circuit at the outer and inner boundaries of the electrically conductive copper paste, the metal plating layer providing an electrically conductive path between the first- and second-layer circuits with an increased sectional area thereof for increasing the electric conductivity of the electrically conductive path and to increase the adhesion force of the second-layer circuit to the first-layer circuit.

SUMMARY OF THE INVENTION

In short, the invention comprises a base board, said base board having a first-layer circuit formed on one side face thereof, said first-layer circuit having a plurality of electrodes and being specifically adapted to a metal plating, an electrically conductive copper paste coated on the electrodes of the first-layer circuit and heated to be hardened, said copper paste being specifically adapted to a metal plating, and the metal plating coated on the first-layer circuit and the electrically conductive copper paste with a predetermined thickness to form a second-layer circuit on the first-layer circuit, which circuits being electrically connected to each other, to thereby form at least two-layer circuits on one side face of the base board, said method comprising the step of coating said electrically conductive copper paste on each of said electrodes of said first-layer circuit to form thereon an electrode of said second-layer circuit in a ring shape having a central opening provided therein as defined by outer and inner boundaries located within each of said electrodes of said first-layer circuit, such that said metal plating of a predetermined thickness may electrically connect said first- and second-layer circuits with an electrically conductive path having an increased sectional area provided therein.

Another aspect of the invention comprises a base board, said base board having a first-layer circuit formed on one side face thereof, said first-layer circuit having a plurality of electrodes and being specifically adapted to a metal plating, an electrically conductive copper paste coated on said electrodes of the first-layer circuit and heated to be hardened, said copper paste being specifically adapted to a metal plating, and the metal plating coated on the first-layer circuit and the electrically conductive copper paste with a predetermined thickness to form a second-layer circuit on the first-layer circuit, which circuits being electrically connected to each other, to thereby form at least two-layer circuits on one side face of the base board, said method comprising the step of coating said electrically conductive copper paste on each of said electrodes of said first-layer circuit to form thereon an electrode of said second-layer circuit in a ring shape having a central opening provided therein as defined by outer and inner boundaries, said outer boundary being located on the outside of each electrode of said first-layer circuit, such that each electrode of said second-layer circuit may have an enlarged area with an accordingly long outer boundary and said metal plating of a predetermined thickness may provide an electrically conductive path between said first- and second circuits at the inner boundary and at a part of said outer boundary of said central opening defining each electrode of said second-layer circuit.

Another aspect of the invention comprises a base board, said base board having a first-layer circuit formed on one side face thereof, said first-layer circuit having a plurality of electrodes and being specifically adapted to a metal plating, an electrically conductive copper paste coated on the electrodes of the first-layer circuit and heated to be hardened, said copper paste being specifically adapted to a metal plating, and the metal plating coated on the first-layer circuit and the electrically conductive copper paste with a predetermined thickness to form a second-layer circuit on the first-layer circuit, which circuits being electrically connected to each other, to thereby form at least two-layer circuits on one side face of the base board, said method comprising the step of coating said electrically conductive copper paste on each of said electrodes of said first-layer circuit to form an electrode of said second-layer circuit, said electrode of the second-layer circuit being defined by outer and inner boundary, said outer boundary being formed with a series of waved arcs each partly extended to the outside of said electrode of said first-layer circuit from the inner side thereof, such that said metal plating of a predetermined thickness may be partly connected to said first-layer circuit at the outer boundary of said electrode of said second-layer circuit to thereby provide an electrically conductive path between said first- and second-layer circuit, said metal plating being partly connected to said base board on the outside of said outer boundary to attach said second-layer circuit to said base board.

Further features and advantages of the invention will be apparent from the following description in reference to preferred embodiments of the invention as shown in the attached drawings.

BRIEF DESCRIPTION OF THE DRAWINGS

FIGS. 1 through 3 show a first embodiment of the invention, of which:

FIG. 1 is a plan view showing an essential part of the invention, in which a metal plating is finished to provide first- and second-layer circuits;

FIG. 2 is a sectional side elevational view taken along the arrows II—III of FIG. 1 in which an electrically conductive copper paste is coated; and FIG. 3 is a sectional side elevational view taken along the arrows II—III in which a metal plating is finished;

FIGS. 6 through 8 show a fourth embodiment of the invention, of which:

FIG. 6 is a plan view showing an essential part of the invention, in which a metal plating is finished to provide first- and second-layer circuits;

FIG. 7 is a sectional side elevational view taken along the arrows VII—VIII of FIG. 6, in which an electrically conductive copper paste is coated; and FIG. 8 is a sectional side elevational view taken along the arrows VII—VIII of FIG. 6, in which a metal plating is finished;

FIGS. 11 through 13 shows a seventh embodiment of the invention, of which:

FIG. 11 is a plan view showing an essential part of the invention, in which a metal plating is finished to provide first- and second-layer circuits;

FIG. 12 is a sectional side elevational view taken along the arrows XII—XIII of FIG. 11, in which an electrically conductive copper paste is coated; and FIG. 13 is a sectional side elevational view taken along the arrows XII—XIII of FIG. 11, in which a metal plating is finished;

FIGS. 15 and 16 show a development of the assignee of the present invention, of which:

FIG. 15 is a plan view showing an essential part of the prior art; and

FIG. 16 is a sectional side elevational view taken along the arrows XVI—XVI of FIG. 15.

DETAILED DESCRIPTION OF THE INVENTION

Figure 1:
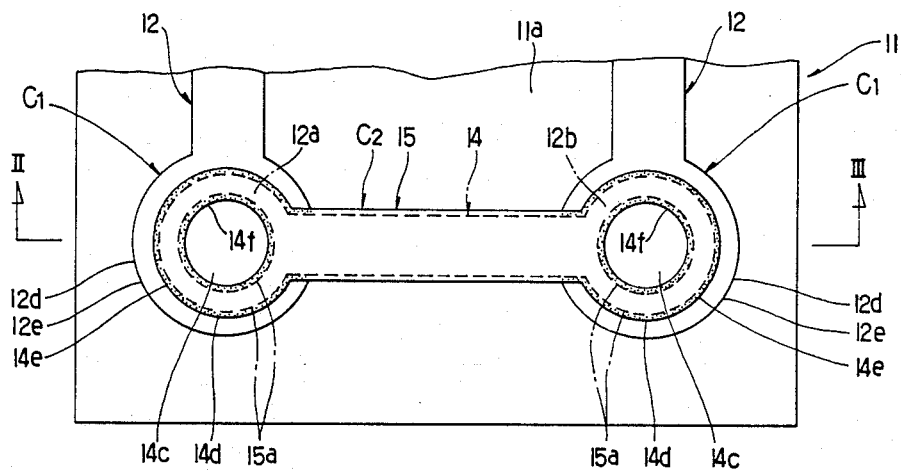

The invention will now be described in reference to preferred embodiments as shown in the drawings. In reference to FIGS. 1 and 2, a base board 11 has a copper lamination 12 attached on one side face thereof and providing a first-layer circuit $C_1$ formed by way of etching. Then a plating-resistant resist 13 is coated by way of printing on the side face of the base board 11 except the portions 12a,12b which are to be electrically connected to a second-layer circuit $C_2$ to be formed on the first-layer circuit $C_1$. Thus the base board 11 has the plating-resistant resist 13 covered on the part 11a thereof where there are no portions to be connected to the second-layer circuit $C_2$.

Figure 3:
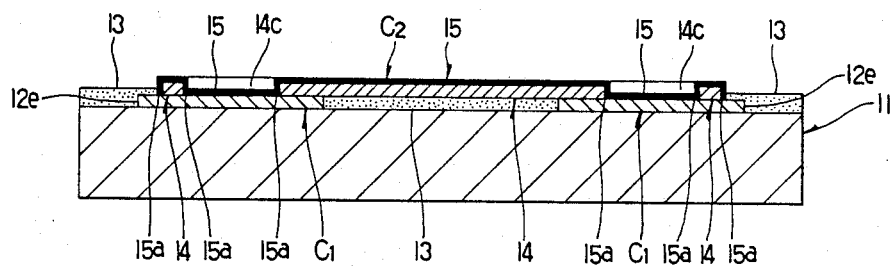

An electrically conductive copper paste 14, which is specifically adapted to a metal plating, is coated by way of screen printing on selected areas covered by resist 13 and on the portions having no resist 13 coated thereon, and then is heated to be hardened and is cleaned. Subsequently as shown in FIG. 3, a chemical copper plating, as an example of a metal plating, is applied to the electrically conductive copper paste to form a copper plating layer 15 as a second-layer circuit $C_2$. Thus the base board 11 has at least two layers of circuits $C_1,C_2$ on one side face thereof which are electrically connected to each other.

According to the invention, the first-layer circuit $C_1$ has a pair of circular electrodes 12d,12d, and the electrically conductive copper paste 14 is coated in a shape of ring on each of the electrodes 12d,12d to form a pair of ring-shaped electrodes 14d of the second-layer circuit $C_2$ having a depressed central opening 14c provided therein in such a manner that the outer and inner boundaries 14e,14f of each electrode 14d are placed within each of the electrodes 12d of the first-layer circuit $C_1$. Thus each of the electrodes 14d of the second-layer circuit $C_2$ is electrically connected to each of the electrodes through the copper coating layer 15 providing annular faces 15a of a predetermined thickness on the outer and inner boundaries 14e,14f of each electrode 14d with an effect to increase the sectional area of the electrically conductive path of the copper plating layer 15.

Figure 15:
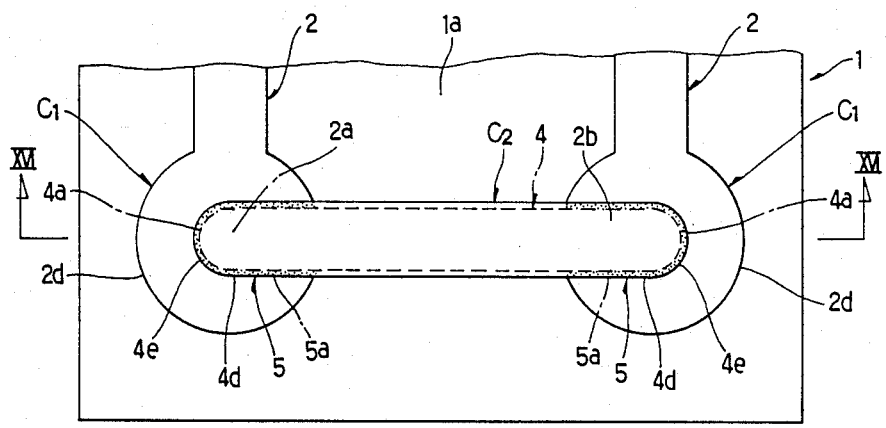
Figure 16:
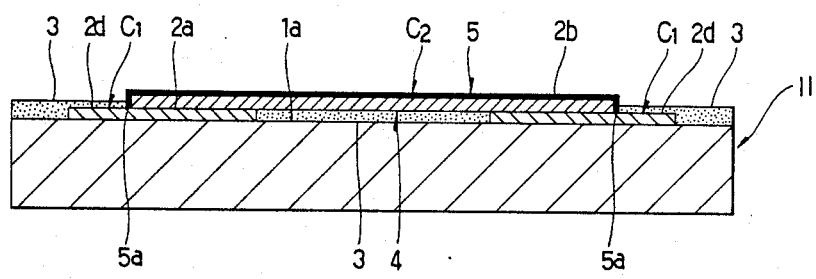

In FIG. 1, the plating-resistant resist 13 is transparent and is not seen, and the annular faces 15a of a predetermined thickness, which are parts of the copper plating layer 15 covered on the electrically conductive copper paste 14 of the second-layer circuit $C_2$, are illustrated by dotted areas for electrically connecting the second-layer circuit $C_2$ to the first-layer circuit $C_1$. The annular faces 15a of the copper plating 15 are coaxially doubled as shown and accordingly have a total sectional area of more than twice as much as those 5a of the prior development as shown in FIGS. 15 and 16. Further the bottom of the depressed central opening 14c, which is a part of the first-layer circuit $C_1$, is covered with the copper plating layer 15 to increase the adherence force of the second-layer circuit $C_2$ to the first-layer circuit $C_1$ and accordingly heighten the electric conductivity.

Figure 2:
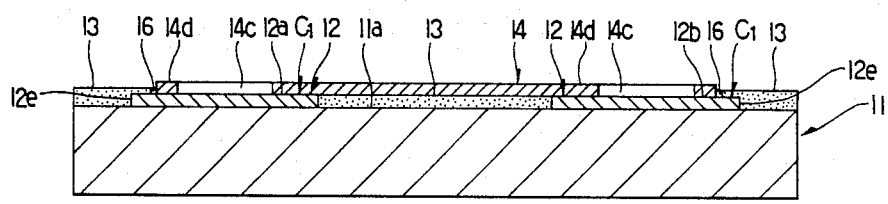

In order to form the annular faces 15a of a predetermined thickness of the copper plating 15 on the outer and inner boundaries 14e,14f of each of the electrodes 14d of the electrically conductive copper paste 14, it is required to coat the plating-resistant resist 13 on the base board 11 while the resist 13 is refrained from being coated on a clearance 16 corresponding to the thickness of the copper plating which is provided around the outer boundary 14e of each electrode 14d of the electrically conductive copper paste 14, and further it is required that the resist 13 is not coated on the bottom of the depressed central space 14c of the first-layer circuit $C_1$ as shown in FIG. 2.

According to the invention, the first-layer circuit $C_1$ is formed by etching the copper lamination 12 attached on the base board 11. However the first-layer circuit may be provided by the electrically conductive copper paste 14, which is coated on one side face of the base board 11 in place of the copper lamination and is then heated to be hardened and is subsequently subject to the copper plating. Further it is needless to say that the first-layer circuit $C_1$ may be formed by a metal other than copper.

The plating-resistant resist 13 may be preferably a resist CR-2001 which has been developed by Asahi Chemical Research Laboratory Co., Ltd. The resist is coated on the base board 11 in the manner as has been described above and is heated at 150° C. for 30 minutes by way of example to be hardened. The electrically conductive copper paste 14 may be preferably a paste ACP-007P which has been developed by Asahi Chemical Research Laboratory Co., Ltd. The paste is coated by way of screen printing on the base board 11 in the manner as has been described hereinbefore and is then heated at 150° C. for 30–60 minutes to be hardened.

As to a pretreatment before formation of the copper plating layer 15, the electrically conductive copper paste 14 is washed for several minutes with a water solution of 4–5% by weight of caustic soda (NaOH) and is then subject to a surface treatment for several minutes with a water solution of 5–10% by weight of hydrochloric acid (HCl). With this surface treatment, many copper particles appear on the surface of the electrically conductive copper paste from among the binders thereof and provide so many nucleuses to make the subsequent copper plating effective. It is therefore not required to make a catalyst treatment which is normally conducted in the non-electrolytic copper plating.

As to the chemical copper plating, the base board 11 is immersed in a chemical copper plating to the surface of the electrically conductive copper paste 14 as shown in FIG. 3 to thereby form the copper plating layer 15. In this case, the chemical copper plating bath is of pH 11–13 and a temperature 65° C.–75° C., and the thickness of the copper plating 15 to be formed is more than 5 $\mu$m, and further the plating speed is 1.5 $\mu$m–3 $\mu$m per hour.

As shown in FIGS. 1 through 3, the base board 11 having the copper plating layer 15 formed thereon is covered with an overcoat (not shown) which may be preferably a plating-resistant resist CR2001 developed by Asahi Chemical Research Laboratory Co., Ltd., and is then heated to be hardened. In this way the base board 11 is finished to have two superposed circuits $C_1$, $C_2$ formed on one side face thereof.

According to the embodiment, the copper plating is applied to the electrically conductive copper paste 14. It is however needless to say that the plating is not limited to the copper plating. The plating may be a silver plating, a gold plating and the like. Further it is apparent that additional circuits may be formed on the overcoat covering the two superposed circuits $C_1$, $C_2$ by repetition of the same processes as mentioned hereinbefore.

Figure 4:
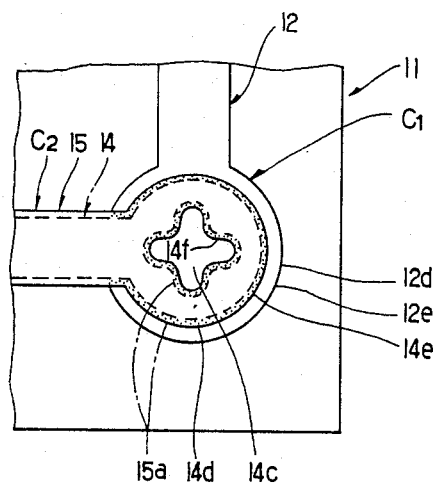
FIG. 4 is a plan view showing an essential part of a second embodiment of the invention.

FIG. 4 shows a second embodiment of the invention, in which the inner boundary 14f of each electrode 14d of the second-layer circuit $C_2$ is made into a cross shape in contrast to the circular outer boundary 14e, so that the copper plating faces 15a of a predetermined thickness may be longer than those of the first embodiment. Accordingly the sectional area of the electrically conductive path of the copper plating is bigger and further the adherence force of the second-layer circuit $C_2$ to the first-layer circuit $C_1$ is more hightened.

Figure 5:
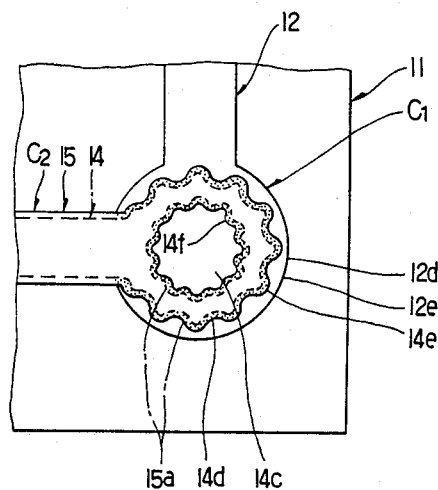
FIG. 5 is a plan view showing an essential part of a third embodiment of the invention.

FIG. 5 shows a third embodiment of the invention, in which the outer and inner boundaries 14e, 14f of each electrode 14d of the second-layer circuit $C_2$ are formed with a series of wave-shaped arcs, and accordingly the total length of the copper plating layer faces 15a of a predetermined thickness is longer than that of the first embodiment, and the sectional area of the electrically conductive path of the copper plating 15 is increased more than those of the first and second embodiments.

Further the adherence force of the second-layer circuit $C_2$ to the first-layer circuit $C_1$ is more hightened.

A fourth embodiment of the invention will be described in reference to FIGS. 6 through 8. A base board 21 has a copper lamination 22 attached to one side face thereof, the copper lamination 22 providing a first-layer circuit $C_1$ formed by an etching process in the manner as generally known.

The base board 21 has a plating-resistant resist 23 coated by way of printing coated thereon except portions 22a, 22b which are required to be electrically connected to an additional circuit to be formed on the first-layer circuit $C_1$. Thus the resist 23 is coated all over the portions 21a of the base board 21, which are not required to be electrically connected to the additional circuit and also which have no part of the first-layer circuit $C_1$ formed thereon.

Then an electrically conductive copper paste 24, which is specifically adapted to a metal plating, is coated by way of screen printing all over the portions of the base board which remain without the resist 23 coated thereon. The base board 21 is then heated to harden the copper paste 24, and subsequently washed to be clean.

Figure 8:
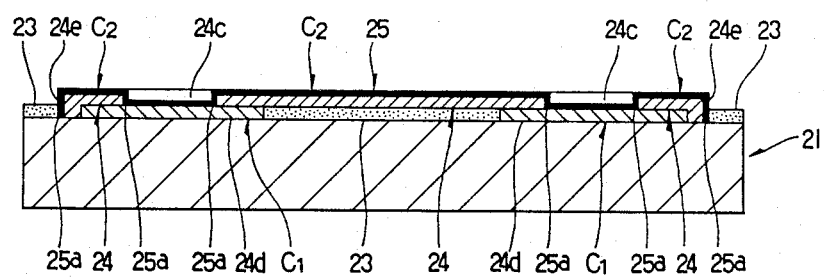

In the next place, a chemical copper plating by way of example as a metal plating is applied to the electrically conductive copper paste 24 to form a copper plating layer 25 thereon, to thereby provide a second-layer circuit $C_2$ of the copper plating layer 25 and the electrically conductive copper paste 24 as shown in FIG. 8. Thus at least two-layer circuits $C_1, C_2$ are formed on one side face of the base board 21 in a manner that the two-layer circuits $C_1, C_2$ are electrically connected to each other.

According to the embodiment, the electrically conductive copper paste 24 is coated in a ring shape on the base board 21 in such a manner that each of the electrodes 24d of the second-layer circuit $C_2$ has an outer boundary 24e located on the outer side 22g of each electrode 22d of the first-layer circuit $C_1$ and further has a depressed central opening 24c provided thereon.

In this way, the second-layer circuit $C_2$ has the electrodes 24d of enlarged area and boundary 24e, and further the copper plating layer 25 with the annular faces 25a of a predetermined thickness is connected to the first-layer circuit $C_1$ at the inner boundary 24f of the central opening 24c and at a part of the outer boundary 24e of the central opening 24c, to thereby form an electrically conductive path between the first- and second-layer circuits $C_1, C_2$.

Figure 6:
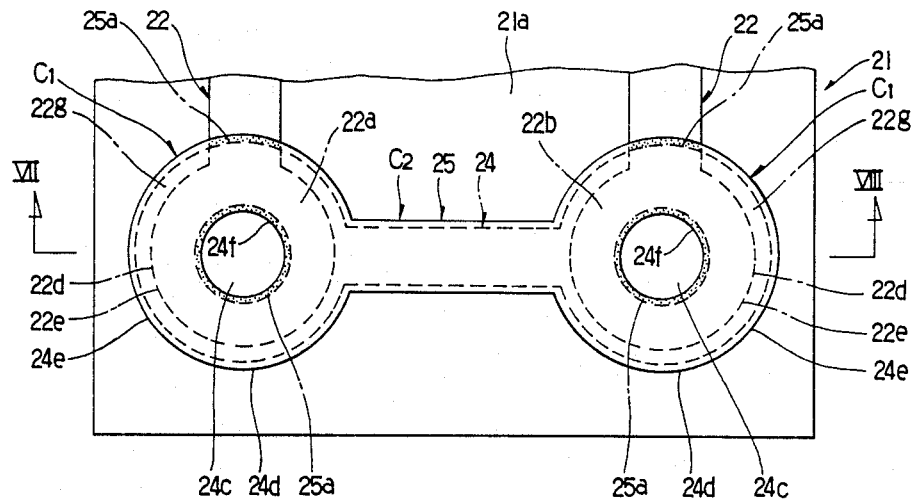

In FIG. 6, the plating-resistant resist 23 is transparent and cannot be seen, and the dotted areas of the annular faces 25a of the copper plating layer 25 covering the electrically conductive paste 24 of the second-layer circuit $C_2$ are connected to the first layer circuit $C_1$ to form the electrically conductive path. The total area of the electrically conductive path is, as shown, composed of the annular face 25a formed on the central part of the electrode 22d of the first-layer-circuit $C_1$ and the part 25a of the copper plating 25 extended transversely of a part of the first-layer circuit $C_1$ which is other than the electrode thereof. Thus the electrically conductive path has a comparatively large sectional area, and further the second-layer circuit $C_2$ is connected to the first-layer circuit $C_1$ with an increased adherence force together with the additional part of the electrode 24d of the second-layer circuit $C_2$ which is formed on the outside 22g of the first-layer circuit $C_1$.

It is needless to say that the central opening 24c of the second-layer circuit $C_2$ may be optionally varied. Further since the central opening 24c has no resist 23 coated on the bottom thereof, the bottom has the copper plating layer 25 coated all thereover to thereby increase the adherence force of the second-layer circuit $C_2$ to the first-layer circuit $C_1$ and to increase the electric conductivity as shown in FIG. 8.

Further in order to form the annular face 25a of a predetermined thickness of the copper plating layer 25 on the outer circumference 24e of each electrode 24d which is formed with the electrically conductive copper paste 24, it is required to coat the resist 23 on the base board in a manner that a clearance 26 corresponding to the thickness of the copper plating layer remains without the resist being coated thereon around the outer boundary of the electrode 24d of the electrically conductive copper paste 24. It is further required not to coat the resist on the bottom of the central opening 24c.

According to the embodiment, the first-layer circuit $C_1$ is formed by etching the copper lamination 22. The first-layer circuit, however, may be formed by the electrically conductive copper paste 24, which is coated on the base board 21 and is then heated to be hardened and is subsequently subject to the chemical copper plating. Further to first-layer circuit $C_1$ may be made of a metal other than copper.

The plating-resistant resist 23 may be preferably a resist CR-2001 which has been developed by Asahi Chemical Research Laboratory Co., Ltd. The resist is coated on the base board 21 in the manner as has been described above and is heated at 150° C. for 30 minutes by way of example to be hardened. The electrically conductive copper paste 24 may be preferably a paste ACP-007P which has been developed by Asahi Chemical Research Laboratory Co., Ltd. The paste is coated by way of screen printing on the base board 21 in the manner as has been described hereinbefore and in then heated at 150° C. for 30–60 minutes to be hardened.

As to a pretreatment before formation of the copper plating layer 25, the electrically conductive copper paste 24 is washed for several minutes with a water solution of 4–5% by weight of caustic soda (NaOH) and is then subject to a surface treatment for several minutes with a water solution of 5–10% by weight of hydrochloric acid (HCl). With this surface treatment, many copper particles appear on the surface of the electrically copper paste from among the binders thereof and provide so many nucleuses to make the subsequent copper plating effective. It is therefore not required to make a catalyst treatment which is normally conducted in the non-electrolytic copper plating.

As to the chemical copper plating, the base board 21 is immersed in a chemical copper plating bath to make a chemical copper plating to the surface of the electrically conductive copper paste 24 as shown in FIG. 8 to thereby form the copper plating layer 25. In this case, the chemical copper plating bath is of pH 11–13 and a temperature 65° C.–75° C., and the thickness of the copper plating to be formed is more than 5 $\mu$m, and further the plating speed is 1.5 $\mu$m–3 $\mu$m per hour.

Figure 7:
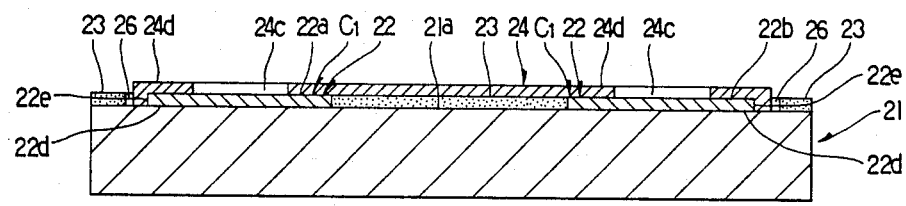

As shown in FIGS. 6 through 8, the base board 21 having the copper plating layer 25 formed thereon is covered with an overcoat (not shown) which may be preferably a plating-resistant resist CR2001 developed by Asahi Chemical Research Laboratory Co., Ltd., and is then heated to be hardened. In this way, the base board 21 is finished to have two superposed circuits $C_1, C_2$ formed on one side face thereof.

According to the embodiment, the copper plating is applied to the electrically conductive copper paste 24. It is however needless to say that the plating is not limited to the copper plating. The plating may be a silver plating, a gold plating and the like. Further it is apparent that additional circuits may be formed on the overcoat covering the two superposed circuits $C_1, C_2$ by repetition of the same processes as mentioned hereinbefore.

Figure 9:
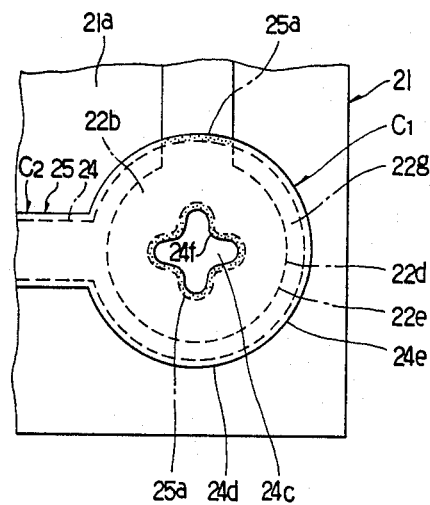
FIG. 9 is a plan view showing an essential part of a fifth embodiment of the invention.

FIG. 9 shows a fifth embodiment of the invention, in which the inner boundary 24f of the electrode 24d of the second-layer circuit $C_2$ is in a cross shape composed of a series of arcs in contrast to the circular inner boundary of the fourth embodiment. Thus the connecting face 25a of the copper plating layer 25 is made longer than that of the fourth embodiment, and accordingly the electrically conductive path of the copper plating layer 25 has a larger sectional area which increases the adherence force of the second-layer circuit $C_2$ to the first-layer circuit $C_1$.

Figure 10:
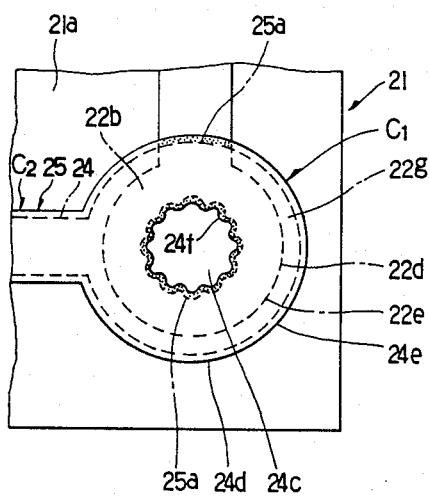
FIG. 10 is a plan view showing an essential part of a sixth embodiment of the invention.

FIG. 10 shows a sixth embodiment of the invention, in which the inner boundary 24f of the electrode 24 of the second-layer circuit $C_2$ is formed with a series of wave shaped arcs in contrast to those of the fifth embodiments. Thus the connecting face 25a of the copper plating layer 25 is made longer than that of the fifth embodiment, and accordingly the electrically conductive path of the copper plating layer 25 has a larger sectional area still further increasing the adherence force of the second-layer circuit $C_2$ to the first-layer circuit $C_1$.

A seventh embodiment of the invention will be described in reference to FIGS. 11 through 13. A base board 31 has a copper lamination 32 attached to one side face thereof, the copper lamination providing a first-layer circuit $C_1$ formed by an etching process in the manner as well known.

The base board 31 has a plating-resistant resist 33 coated by way of printing thereon except portions 32a, 32b which are required to the electrically connected to an additional circuit to be formed on the first-layer circuit $C_1$. Thus the resist 33 is coated all over the portions 31a of the base board 31, which are not required to be electrically connected to the additional circuit and also which have no part of the first-layer circuit $C_1$ formed thereon.

Then an electrically conductive copper paste 34, which is specifically adapted to a metal plating, is coated by way of screen printing all over the portions of the base board 31 which remain without the resist 33 coated thereon, and is then heated to be hardened and subsequently washed to be clean.

Figure 13:
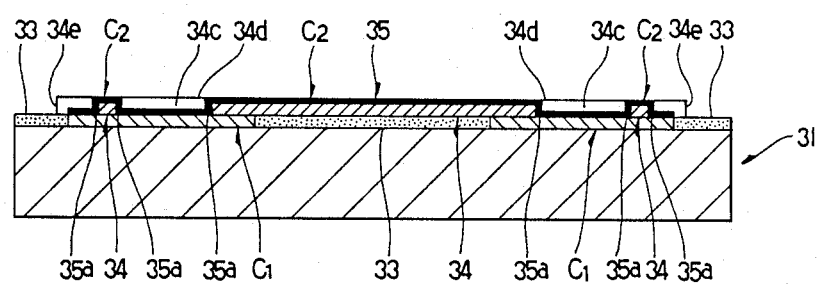

In the next place, a chemical copper plating by way of example as a metal plating is applied to the electrically conductive copper paste 34 to form a copper plating layer 35, to thereby provide a second-layer circuit $C_2$ of the copper plating layer 35 and the electrically conductive copper paste 34 as shown in FIG. 13. Thus at least two-layer circuits $C_1, C_2$ are formed on one side face of the base board 31 in a manner that the two-layer circuits are electrically connected to each other.

According to the embodiment, the electrically conductive copper paste 34 is coated on the base board 31 in such a manner that the second-layer circuit $C_2$ has electrodes 34d each defined by an outer boundary 34e of a series of waved arcs each partly extended from the inner side $32f$ of each electrode $32d$ of the first-layer circuit $C_1$ to the outside $32g$ thereof.

In this way, the copper plating layer 35 has one of the faces $35a$ of a predetermined thickness connected to the first-layer circuit $C_1$ at the outer circumference $34e$ of each electrode $34d$ of the second-layer circuit $C_2$ to thereby provide an electrically conductive path between the first- and second-layer circuits $C_1, C_2$, and the other faces $35a$ of the copper plating layer 35, at the outer boundary $34e$ of the second-layer circuit $C_2$, are connected to the base board 31 on the outside of each electrode $32d$ of the first-layer circuit $C_1$.

Further according to the embodiment, the electrically conductive copper paste 34 is coated in a ring shape on the base board 31 in such a manner that the second-layer circuit $C_2$ has the electrode $34d$ having a central opening $34c$ provided therein. It is therefore apparent that the copper plating layer 35 has the faces $35a$ of a predetermined thickness connected to the first-layer circuit $C_1$ at the inner boundary $34f$ and at one part of the outer circumference $34e$ of each electrode $34d$ of the second-layer circuit $C_2$, to thereby enlarge the sectional area of the electrically conductive path formed between the first- and second-layer circuits $C_1, C_2$. It is further noted that the inner boundary $34f$ of the second-layer circuit $C_2$ is circular.

Figure 11:
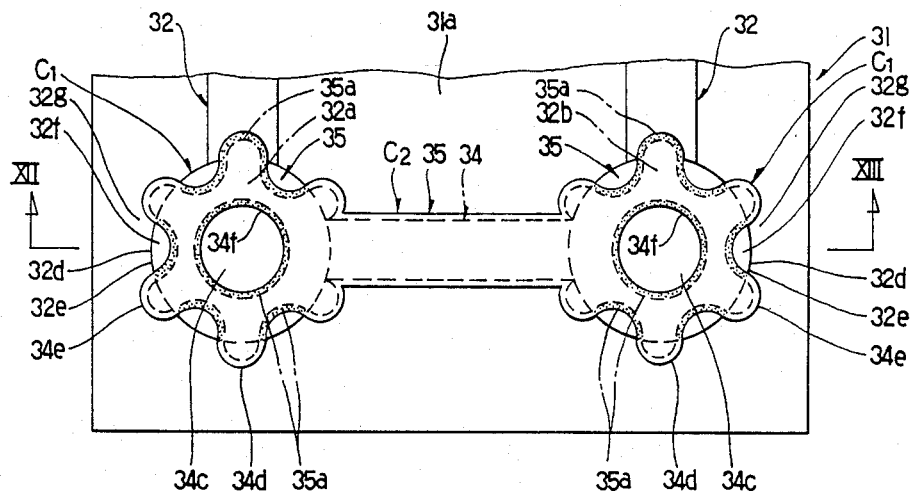
Figure 12:
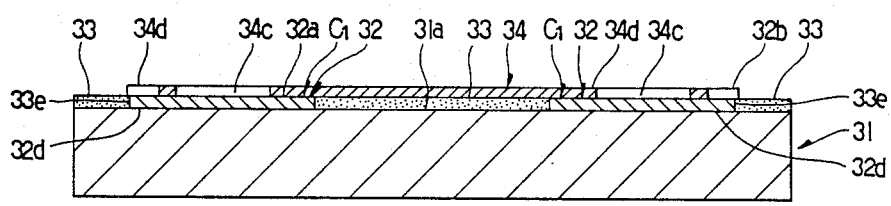

In FIG. 11, since the plating-resistant resist 33 is transparent, the resist can not be seen. The copper plating layer 35 covering the electrically conductive copper paste 34 is partly shown by the dotted areas electrically connecting the second-layer circuit $C_2$ to the first-layer circuit $C_1$. The total of the dotted areas is composed of the inner circular boundary $34f$ defined by the electrically conductive copper paste 34 on the electrode $32d$ of the first-layer circuit $C_1$ and so many waved parts of the outer boundary $34e$ located on the inside of the electrode $32d$ of the first-layer circuit $C_1$, which totally provide the electrically conductive path.

Such doubled faces $35a$ of a predetermined thickness in the outer and inner boundaries $34e, 34f$ are designed to secure the electrically conductive path having a sectional area remarkably larger than that of the prior art as shown in FIG. 15. Further the parts of the electrode $34d$ of the second-layer circuit $C_2$ located on the outside of the first-layer circuit $C_1$ are effective to increase the adherence force of the second-layer circuit $C_2$ to the first-layer circuit $C_1$. Since the resist 33 is not coated on the bottom of the central opening $34c$, the copper plating layer 35 is formed all thereover to thereby more increase the adherence force as well as the electric conductivity, further with the additional copper plating layer 35 formed on the inner parts $32f$ of the electrode $32d$ of the first-layer circuit $C_1$.

According to the embodiment, the first-layer circuit $C_1$ is formed by etching the copper lamination 32. The first-layer circuit, however, may be formed by the electrically conductive copper paste 34, which is coated on the base board 31 and is then heated to be hardened and is subsequently subject to a chemical copper plating. Further the first-layer circuit may be made of a metal other than copper.

The plating-resistant resist 33 may be preferably a resist CR-2001 developed by Asahi Chemical Research Laboratory Co., Ltd. The resist is coated on the base board 31 in the manner as has been described above and is heated at 150° C. for 30 minutes by way of example to be hardened.

The electrically conductive copper paste 34 may be preferably a copper paste ACP-007P developed by Asahi Chemical Research Laboratory Co., Ltd. The copper paste is coated by way of screen printing on the base board 31 in the manner as has been described hereinbefore and is then heated at 150° C. for 30-60 minutes to be hardened.

As to a pretreatment before formation of the copper plating layer 35, the electrically conductive copper paste 34 is washed for several minutes with a water solution of 4-5% by weight of caustic soda (NaOH) and is then subject to a surface treatment for several minutes with a water solution of 5-10% by weight of hydrochloric acid (HCl). With this surface treatment, many copper particles appear on the surface of the electrically conductive copper paste from among the binders thereof and provide so many nucleuses to make the subsequent copper plating effective. It is therefore not required to make a catalyst treatment which is normally conducted in the non-electrolytic copper plating.

As to the chemical copper plating, the base board 31 is immersed in a chemical copper plating bath to make a chemical copper plating to the surface of the electrically conductive copper paste 34 as shown in FIG. 13, to thereby form the copper plating layer 35. In the case, the chemical copper plating bath is of pH 11-13 and a temperature 65° C.- 75° C., and the thickness of the copper plating to be formed is more than 5 $\mu$m, and further the plating speed is 1.5-3 $\mu$m per hour.

As shown in FIGS. 11 and 13, the base board 31 having the copper plating layer 35 formed thereon is covered with an overcoat (not shown) which may be preferably a plating-resistant resist CR2001 developed by Asahi Chemical Research Laboratory Co., Ltd., and is then heated to be hardened. In this way, the base board 31 is finished to have two superposed circuits $C_1, C_2$ formed on one side face thereof.

According to the embodiment, the copper plating is applied to the electrically conductive copper paste 34. It is however needless to say that the plating is not limited to the copper plating. The plating may be a silver plating, a gold plating and the like. Further it is apparent that additional circuits may be formed on the overcoat covering the two superposed circuits $C_1, C_2$ by repetition of the same processes as mentioned hereinbefore.

Figure 14:
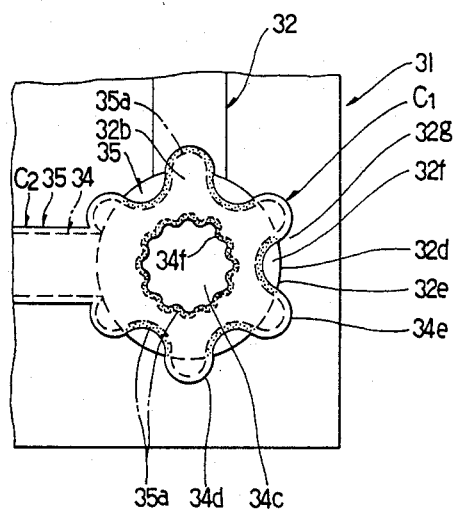
FIG. 14 is a plan view showing an essential part of an eighth embodiment of the invention.

FIG. 14 shows an eighth embodiment of the invention, in which the electrode $34d$ of the second-layer circuit $C_2$ has an inner boundary $34f$ formed with a series of waved arcs in contrast to the circular one of the seventh embodiment. Therefore the connecting face $35a$ of a predetermined thickness of the copper plating layer 35 is longer than that of the seventh embodiment, to thereby provide an electrically conductive path of a larger sectional area and to more increase the adherence force of the second-layer circuit $C_2$ of the first-layer circuit $C_1$.

Now it will be necessary to explain in detail the electrically conductive copper paste and the plating-resistant resist to be used in this invention.

As mentioned hereinbefore, the electrically conductive copper paste may be preferably a paste ACP-007P developed by Asahi Chemical Research Laboratory Co., Ltd. which is specifically adapted to the copper plating. Copper is generally easy to be oxidized. The copper particles are more easily oxidized because these have a larger surface area. It is therefore required to provide paste components, instead of a paste containing nonoxidizable precious metal particles, which may remove the oxidized film of copper and further prevent the reoxidization of copper. In order to provide an electrically conductive copper paste which is specifically adapted to a metal plating and specifically adhesive to a base material, it is important to select and properly knead the components such as copper particles, binder, specific additive for preventing oxidization (such as, for example, anthracene, anthracene carboxylic acid, anthradin, anthranilic acid), dispersant, and solvent.

The copper particles are different in shape and diameter in dependence upon the production method. With the electrolytic method, in which copper is exposed in a condition of particles, the twiggy copper particles of high quality can be obtained. With the reduction method, in which the oxides are reduced by a reduction gas, the porous fine metal particles can be obtained.

In order to form up the electrically conductive circuits according to the invention as mentioned hereinbefore, the electrically conductive copper paste must have the following properties;

(1) to be specifically adapted to a screen printing and to formation of fine patterns;
(2) to be closely adhesive to the base board;
(3) to be sufficiently resist a high temperature alkali bath in case of a chemical copper plating;
(4) to be closely adhesive to the copper plating; and
(5) little deterioration of viscosity in the lapse of time and stabilized for printing.

For satisfying such requirements, the electrically conductive copper paste contains much amount of the twiggy copper particles of high quality as obtained by the electrolytic method and the porous fine metal particles obtained by the reduction method. The copper particles may be further processed into flakes (ground particles). It is further required to include the copper particles of different shapes and diameters with a maximum density so as to highten the content rate of the copper particles in the paste.

As to the binder, the component is required to act as a vechicle for disperse so much copper particles and as an effective adhesive to the base board, and is further required to sufficiently resist the alkali bath in case of the chemical copper plating.

It is therefore preferable that the binder is an epoxy resin having a property of high content rate of copper particles and extremely adhesive to a copper lamination and a glass epoxy base board, and excellent for the plating deposition and for the plating film adhesion.

As to the property of the copper plating deposited on the electrically conductive copper paste developed by Asahi Chemical Research Laboratory Co., Ltd., the copper plating is reddish brown in a condition of paste and has a viscosity of 300-500 ps at 25° C. and has an adhesion to a copper lamination and a resin base board approved by a taping test. Further the adhesion property to the electrically conductive paste has been confirmed by the taping test. The soldering property is more than 96% as to the extension rate and is more than 3.0 kg as to the tensile force ($3\times 3$ mm$^2$).

The components of the electrically conductive copper paste and the conductivity thereof are mentioned in detail in the same applicant's Japanese Patent applications 55-6609 (laid open: 56-103260) (corresponding U.S. Pat. No. 4,353,816) and 60-216041 (corresponding U.S. patent application of Ser. No. 06/895,716 now U.S. Pat. No. 4,734,156, and therefore the description thereof is omitted herein.

With respect to the plating-resistant resist such as the resist CR-2001 developed by Asahi Chemical Research Laboratory Co., Ltd. so as to be used in the present invention, this resist is coated on a first circuit which is not electrically connected to a second circuit which is to be formed on the first circuit. Therefore the resist is required to have an isolating property and at the same time an alkali-resistant property. Actually the resist has been developed to maintain the acidity more than 4 hours in the alkali bath of 70° C. and of pH12 just like the copper chemical plating bath.

Similar to the electrically conductive copper paste ACP-007P, the resist contains as a main component an epoxy resin and is printed through a 180-mesh polyester screen and then is heated for 30 minutes at the temperature 150° C. so as to be hardened. The printing film is preferably 15-30 $\mu$m so as to resist chemicals and voltages. The main features are as follows: The resist is easily adhered to the base on which the resist is coated, and to a copper lamination and further is not deteriorated if it is immersed in the alkali bath of pH12 for a long time. The resist is quite safe in the practical use because the hardener to be used is alkali having little poison. The resist is coated by way of screen printing and has a hardener 10 g mixed with the principal component 100 g thereof, and is hardened in a set time 15-30 minutes at the temperature 150°-200° C.

The plating resistant resist is green in the condition of ink and has an adhesion (cross-cut) 100/100 on a copper lamination, a surface hardness of more than 8 H when measured by a pencil, a solvent resistant property (in trichloroethylene) of more than 15 sec., a soldering heat (260° C.) resistant property of more than 5 cycles, a surface isolation resistance value of more than $5\times 10^{13}\Omega$, a volume resistance value of $1\times 10^{14}\Omega$—cm, a voltage (15 $\mu$m) resistant property of more than 3.5 kV and a dielectric tangent (1 MH$_z$) of less than 0.03.

The resist CR-2001 is composed, as the main components, of cresolnovolack type epoxy resin, magnesia silicate mineral filler, silicone coating additive and butylcarbitol solvent, and as the hardeners, guanidine compound, imidazol derivative and butylcarbitol solvent. In this connection, the mixing rate of the main components and the hardeners is 100 g:10 g.

With the invention being described as above, it will be obvious that the same may be modified in many ways. Such modifications or variations will not be regarded as a departure from the spirit and scope of the invention. Such modifications or variations will be included within the scope of the following claims.

What is claimed is:

1. In a method for producing electrically conductive circuits on a base board, said base board having a first-layer circuit formed on one side face thereof, said first-layer circuit having a plurality of electrodes and being specifically adapted to receive a metal plating, an electrically conductive copper paste coated on the electrodes of the first-layer circuit and heated to be hardened, said copper paste being specifically adapted to receive a metal plating, and a metal plating coated on the first-layer circuit and the electrically conductive copper paste with a predetermined thickness to form a second-layer circuit on the first-layer circuit, said circuits being electrically connected to each other thereby to form at least two layer circuits on one side face of the base board, the improvement wherein said method comprises the step of coating said electrically conductive copper paste on each of said electrodes of said first-layer circuit to form thereon an electrode of said second-layer circuit in a ring shape having a central opening provided therein as defined by outer and inner boundaries located within each of said electrodes of said first-layer circuit, such that said metal plating of a predetermined thickness electrically connects said first- and second-layer circuits with an electrically conductive path having an increased sectional area provided therein.

2. The method as defined in claim 1, wherein said metal plating is a chemical copper plating.

3. The method as defined in claim 1, wherein said outer and inner boundaries of said second-layer circuit are circular.

4. The method as defined in claim 1, wherein said outer and inner boundaries of said second-layer circuit are cross-shaped.

5. The method as defined in claim 1, wherein said outer and inner boundaries of said second-layer circuit are formed with a series of wave-shaped arcs.

6. In a method for producing electrically conductive circuits on a base board, said base board having a first-layer circuit formed on one side face thereof, said first-layer circuit having a plurality of electrodes and being specifically adapted to receive a metal plating, an electrically conductive copper paste coated on said electrodes of the first-layer circuit and heated to be hardened, said copper paste being specifically adapted to receive a metal plating, and a metal plating coated on the first-layer circuit and the electrically conductive copper paste with a predetermined thickness to form a second-layer circuit on the first-layer circuit, said circuits being electrically connected to each other, thereby to form at least two layer circuits on one side face of the base board, the improvement wherein said method comprises the step of coating said electrically conductive copper paste on each of said electrodes of said first-layer circuit to form thereon an electrode of said second-layer circuit in a ring shape having a central opening provided therein as defined by outer and inner boundaries, said outer boundary being located on the outside of each electrode of said first-layer circuit, such that each electrode of said second-layer circuit has an enlarged area with an accordingly long outer boundary and said metal plating of a predetermined thickness provides an electrically conductive path between said first- and second circuits at the inner boundary and at a part of said outer boundary of said central opening defining each electrode of said second-layer circuit.

7. The method as defined in claim 6, wherein said metal plating is a chemical copper plating.

8. The method as defined in claim 6, wherein said outer and inner boundaries of each electrode of said second-layer circuit are circular.

9. The method as defined in claim 6, wherein said inner boundary of each electrode of said second-layer circuit is in a cross shape defined with a series of arcs.

10. The method as defined in claim 6, wherein said inner boundary of each electrode of said second-layer circuit is defined with a series of waved arcs.

11. In a method for producing electrically conductive circuits on a base board, said base board having a first-layer circuit formed on one side face thereof, said first-layer circuit having a plurality of electrodes and being specifically adapted to receive a metal plating, an electrically conductive copper paste coated on said electrodes of the first-layer circuit and heated to be hardened, said copper paste being specifically adapted to receive a metal plating, and a metal plating coated on the first-layer circuit and the electrically conductive copper paste with a predetermined thickness to form a second-layer circuit on the first-layer circuit, said circuits being electrically connected to each other, thereby to form at least two layer circuits on one side face of the base board, the improvement wherein said method comprises the step of coating said electrically conductive copper paste on each of said electrodes of said first-layer circuit to form an electrode of said second-layer circuit, said electrode of the second-layer circuit being defined by outer and inner boundaries, said outer boundary being formed with a series of waved arcs each partly extended to the outside of said electrode of said first-layer circuit from the inner side thereof, such that said metal plating of a predetermined thickness is partly connected to said first-layer circuit at the outer boundary of said electrode of said second-layer circuit to thereby provide an electrically conductive path between said first- and second-layer circuit, said metal plating being partly connected to said base board on the outside of said outer boundary to attach said second-layer circuit to said base board.

12. The method as defined in claim 11, wherein said outer and inner boundaries define a central opening of said electrode of said second-layer circuit, such that said metal plating of a predetermined thickness being connected to said first-layer circuit at said inner boundary and at the parts of said outer boundary to thereby increase the sectional area of said electrically conductive path.

13. The method as defined in claim 12, wherein said inner boundary is circular.

14. The method as defined in claim 12, wherein said inner boundary is defined by a series of waved arcs.

15. The method as defined in claim 11, wherein said metal plating is a chemical copper plating.

* * * * *